United States Patent [19]

Abbiati et al.

[11] Patent Number: 5,138,275
[45] Date of Patent: Aug. 11, 1992

[54] PREDISTORTION LINEARIZER FOR MICROWAVE POWER AMPLIFIERS

[75] Inventors: Antonio Abbiati, Angelo Lodigiano; Carlo Buoli, Mirandola; Luigi Cervi, Olmeneta, all of Italy

[73] Assignee: Siemens Telecomunicazioni S.p.A., Italy

[21] Appl. No.: 681,739

[22] Filed: Apr. 8, 1991

[30] Foreign Application Priority Data

Apr. 9, 1990 [IT] Italy ............... 19975 A/90

[51] Int. Cl.$^5$ .................................. H03F 1/32
[52] U.S. Cl. ............................ 330/149; 330/277
[58] Field of Search ........... 330/149, 277; 328/162; 332/123, 159, 160; 375/60; 455/50, 63

[56] References Cited

U.S. PATENT DOCUMENTS 3,996,524 12/1976 Sechi .................................. 330/277
4,465,980 8/1984 Huang et al. ..................... 330/149

FOREIGN PATENT DOCUMENTS

19497 A/87 2/1987 Italy .

Primary Examiner—James B. Mullins
Attorney, Agent, or Firm—Hill, Van Santen, Steadman & Simpson

[57] ABSTRACT

A predistortion linearizer for microwave power amplifiers wherein a single transistor, e.g. of the GaAsFET type, is subpolarized near the pinch-off condition, and carries out the functions both of a gain expander amplifier for recovery of amplitude distortion of the power amplifier and as a command signal generator for a dephaser element for recovery of the phase distortion of the power amplifier.

15 Claims, 2 Drawing Sheets

FIG. 1
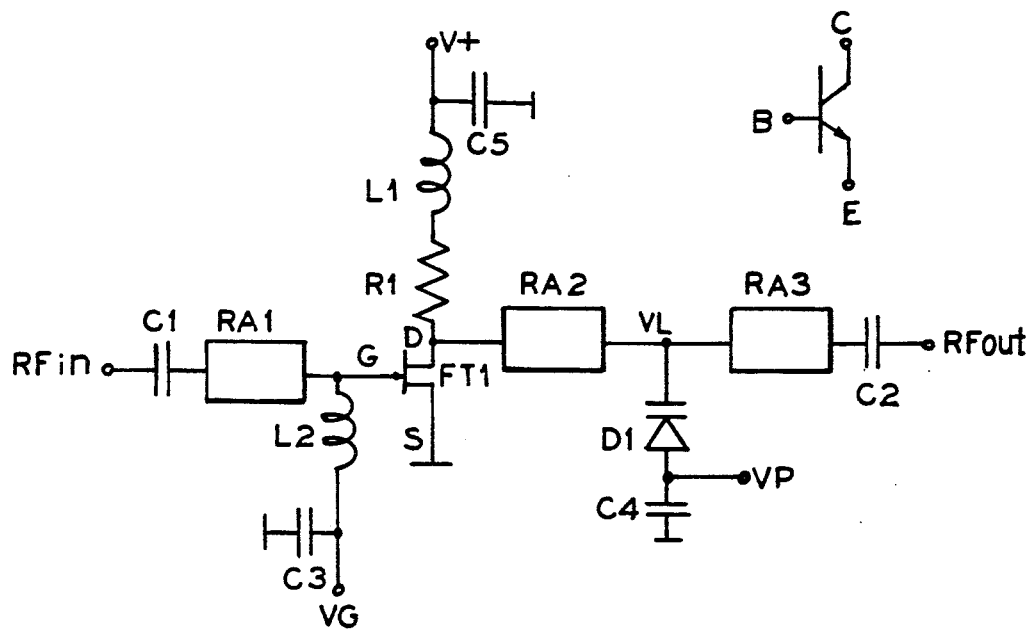
FIG. 1A
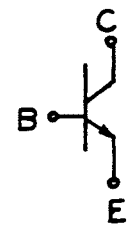
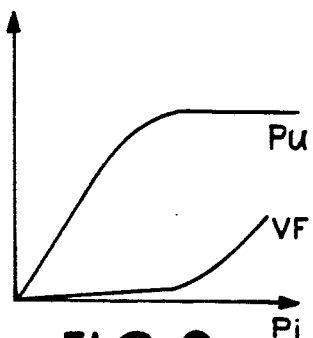
FIG. 2
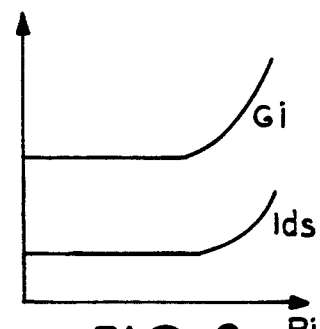
FIG. 3
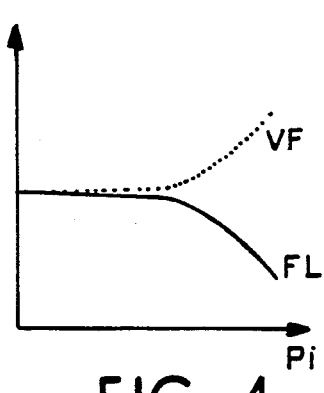
FIG. 4
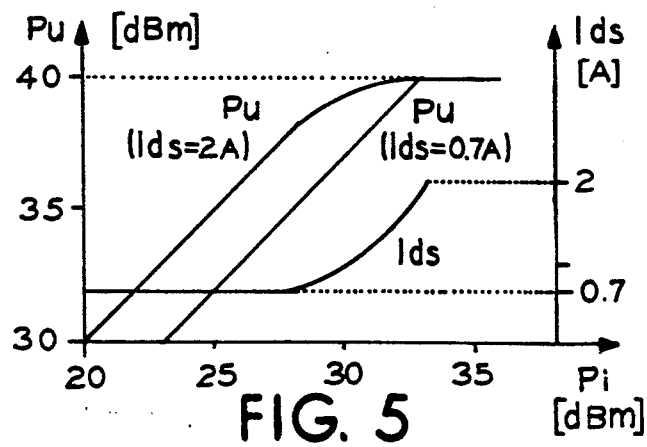
FIG. 5

PREDISTORTION LINEARIZER FOR MICROWAVE POWER AMPLIFIERS

BACKGROUND OF THE INVENTION

The present invention relates to improvements in microwave power amplifiers.

Modulations presently in use in radio links, essentially Quadrature Amplitude Modulation (QAM), impose very stringent linearity requirements for the radio frequency power amplifier of the transmitter on which depends not a little the degradation of the modulated signal.

The power output from the final amplifier devices must be considerably lower than their saturation power so that the nonlinear distortions thereof introduced satisfy the specifications of the transmitter. These distortions are due to compression of gain at high power found in the trend of the Amplitude Modulation (AM-/AM) distortion curve at high power and the amplitude modulation/phase modulation (AM/PM) conversion curve, again at high power.

Obviating these distortions usually involves oversizing these final amplifiers and hence high cost of the power amplifying section.

As known in itself, use of a linearizing network in the transmitting section permits use of power devices with lower saturation for a given distortion produced with a resulting increase of efficiency, e.g. for application in the transmitters of on-board repeaters in satellite communication systems or, for a given saturation power of final devices, such use also allows higher linearity of the amplifier, e.g. for applications in transmitters for earth stations in such satellite communication systems.

A linearization technique presently well known is termed "feed forward error control", and includes all the linearizers which use an auxiliary microwave amplifier which amplifies an error signal obtained by determining the difference between the input signal and the distorted one appropriately attenuated at the output from the main amplifier. The error signal is proportional to the distortions generated by the main amplifier so that, again added with appropriate phase and amplitude at the output of the main amplifier, this error signal reduces the distortions affecting the output signal.

It is clear that the merit figure or degree of quality of this linearization system depends almost exclusively on the balancing of the final adder or coupler which subtracts the error signal from the output signal of the amplifier. A balancing regulation circuitry (in amplitude and phase) of this coupler is therefore necessary and is quite complex. In addition, it is a true amplifier-linearizer complex in itself, not an addition to improve a known amplifier.

Another present linearization technique calls for the use of RF (radio frequency) predistorters, i.e. nonlinear networks inserted upstream of the final microwave amplifier, which distort the input signal by means of networks embodied with components which work in a nonlinear state in order to compensate for the AM/AM distortion curve and the amplitude/phase conversion curve AM/PM of the final power amplifier, and which guarantee better linearity of the transmitting section. The main drawback of these known predistorters consists, however, of the excessive complexity of said networks, and thus of their still excessive cost.

An example of a predistortion linearizer for microwave power amplifiers is described in Italian patent application No. 19497-A/87 filed by the same applicant Feb. 26, 1987, and incorporated herein.

In this previous Italian patent application there is described a predistortion linearizer applicable upstream of the power amplifier and which has a main network including a phase modulator and an amplitude modulator arranged in cascade. A secondary network with a base band frequency is provided. It includes means for amplitude detecting and filtering part of the input signal so as to produce a detected signal which is a function of the instantaneous input power. A pair of adjustable gain amplifiers are supplied with the detected signal and act on the modulators in such a manner as to give them nonlinear response curves, such as to compensate independently for both amplitude and phase nonlinearity of the power amplifier.

Such a linearizer, although it has all the advantages compared with the known art listed in the application, is still a costly and cumbersome embodiment, principally because of the presence therein of derived branches.

SUMMARY OF THE INVENTION

Accordingly, an object of the present invention is to overcome the above drawbacks and to provide a predistortion linearizer for microwave power amplifiers which is extremely simplified in its circuit structure. Indeed it comprises essentially a single transistor which carries out the functions both of the gain expander amplifier for recovery of the amplitude distortion of the power amplifier and as a generator of a command signal for a phase shift element for recovery of the phase distortion of the power amplifier. In a first form of the embodiment, this single transistor is placed upstream of the final power amplifier and is followed by the phase shift element. In a second form of the embodiment, its function is fulfilled by the same final power amplifier.

According to the invention, a first subpolarized transistor means provides gain expansion with increase in power of a signal at its input. A phase shifter means controlled by a continuous component of voltage present at an output of the first transistor means introduces a phase distortion for offsetting the phase distortion of the final power amplifier.

Further objects and advantages of the present invention will be made clear by the following detailed description of an embodiment thereof and the annexed drawings given for purely nonlimiting explanatory purposes.

BRIEF DESCRIPTION OF THE DRAWINGS

FIG. 1 shows a circuit diagram of a first example of a realization of the linearizer which is an object of the present invention;

FIG. 1A shows a bipolar transistor which can replace the FET FT1 shown in FIG. 1;

FIGS. 2, 3, 4, and 5 show the trends of some characteristic parameters of the linearizer and final power amplifier as a function of the power Pi of the input signal;

DESCRIPTION OF THE PREFERRED EMBODIMENTS

Figure 6:
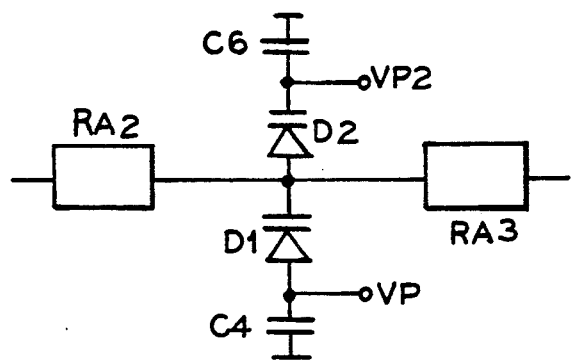
FIG. 6 shows a first embodiment variation of the phase shift element D1 of FIG. 1.

FIG. 1 shows a circuit embodiment of the linearizer which is an object of the invention and is applied upstream of a power amplifier for the purpose of compensating for the amplitude and phase distortions. Indeed, the amplitude and phase response curves of a microwave power amplifier are typically as shown in FIG. 2 wherein is shown the qualitative shape of the output power Pu (AM/AM distortion curve) and the input-output phase variation VF (AM/PM conversion curve) as a function of input power Pi. The linearizer thus has a dual purpose. First, it expands its own gain at the Pi values so that in FIG. 2 the knee of the curve Pu occurs to compensate for said knee and continue the linear shape of pu even in the immediate proximity of saturation. This latter zone is indicated by a horizontal shape which, however, cannot be offset. The second purpose is to vary its own input-output phase in a manner opposite to the shape of VF in FIG. 2.

In FIG. 1, RFin, RFout indicate the input and output connectors respectively of a radiofrequency signal.

C1, C2 . . . C5 indicate capacitances and L1, L2 inductances of a known type.

FT1 indicates a GaAsFET transistor (with gallium arsenide field effect) equipped as known with three connectors, namely a source S, drain D, and gate G1, used in a common source configuration.

R1 indicates a polarization resistance of FT1.

D1 indicates a varactor diode.

RA1, RA2, RA3 indicate common impedance matching networks for input, interstage, and output, respectively, and embodied, for example, in a microstrip.

VG, VP indicate the supply voltages of the gate of FT1 and of the anode of D1, and V+ indicates a fixed positive.

C1 and C2 are used as blocking capacitances of the continuous component at the input RFin and the output RFout, respectively. C4 and the networks C3-L2, C5-L1 form low-pass decoupling filters between the signal and the supplies VG, VP, and V+. C3, C4, and C5 have a grounded end.

The input signal is applied to the gate of FT1 through C1 and RA1. The voltage Vg is also applied to the gate of FT1 through the filter C3-L2. The source of FT1 is connected to ground, while the voltage V+ is brought to the drain through the filter C5-L1 and the resistance R1. The cathode of the diode D1 is also connected continuously to the drain of FT1 through the network RA2, and to the output RFout through the network RA3 and C2.

The transistor FT1 amplifies the RF signal applied at the input RFin. The values of fixed supply voltage V+, resistance R1, and voltage VG are chosen in such a manner as to keep FT1 in underpolarization conditions, i.e. with the working point near the pinch-off region (low values of drain-source current Ids and gate-source voltage Vgs).

In this manner an increase in the power of the Rf input signal is capable of changing the working point of the device, i.e. increasing the continuous component of the current Ids. Since the gain of FT1 depends on the continuous component of Ids, the increase of the latter causes an increase in gain and supplies the desired expansion effect.

FIG. 3 shows the qualitative shape of the gain curve Gi obtained as a function of the power Pi of the signal RF at the input RFin. By varying the parameters of the polarization network of FT1, i.e. VG, R1 and V+, it is possible to obtain a shape of Gi optimized from the point of view of compensation of the AM/AM distortion curve. The figures also show as a function of Pi the corresponding qualitative shape of the continuous component of Ids.

Due to the presence of the resistance R1, as the continuous component of Ids increases, the continuous component of the drain-source voltage Vds of FT1 decreases, and hence that of the polarization voltage VL of the varactor diode D1 (indeed D1 is connected continuously to the drain of FT1).

Thus, a detected voltage of the modulating signal proportional to the continuous component of Ids is localized and is used as a control signal of the phase variation introduced by the downstream device which, in the nonlimiting example described, is the varactor diode D1.

The effect obtained is thus a modulation of the voltage VL which, as is known, influences the internal capacitance value of the varactor and hence the phase shift introduced therefrom onto the RF signal. This effect can be used with advantage to offset the conversion curve AM/PM.

FIG. 4 shows the qualitative shape of the phase variation FL as a function of the power Pi of the input signal. The shape of FL can be made specular in relation to that of VF (shown with broken line in FIG. 4) by appropriate sizing of the parameters which influence it, i.e. R1 and VP.

To sum up, the transistor FT1 fulfills a dual function: that of gain expander to offset the AM/AM distortion curve and that of detector of a modulation voltage which directly pilots a phase shifter to offset the AM/PM conversion curve.

More specifically, the gain expansion characteristic is adjusted by varying VG, and the phase characteristic is adjusted by varying VP.

The device of FIG. 1 follows very rapidly the dynamics of the input signal RF, i.e. its response as a gain expander and phase shifter is a wide band for the modulating signal because it consists of a signal RF branch. This is in effect very important because it makes the device usable even when the multicarrier modulating signal is wide band, e.g. in transponders for satellites.

In addition, there is an undoubted advantage in terms of size and cost reduction of the components of the linearizer which can be embodied with microstrip or Microwave Integrated Circuit (MIC) technology using both discrete packaged components and chip-and-wire or integrated in Monolithic MIC (MMIC) technology.

Numerous variations on the embodiment described as an example in FIG. 1 are possible, without going beyond the scope of the innovative principles contained in the invention concepts herein.

The linearization function can be performed by the final power stage comprised, for example, of a transistor of the FT1 type of FIG. 1, brought to a similar working condition.

This may be explained by a digital example also with reference to FIG. 5 which shows the shapes of the output power Pu of the final power stage in two working conditions, normal (Ids=2A) and modified in accordance with the invention (Ids-0.7A), respectively, and which also shows the shape of the continuous component Ids of the drain current of the transistor of the final stage, as a function of the input power Pi.

Assume a final power stage comprised of a GaAs-FET transistor which in linear conditions has a gain of 10 dB with a working point of Fds=10 V, Ids=2A, and an output saturation power Pusat=40 dBm at modulated signal frequencies of approximately 6–7 GHz. Under these conditions, the shape of output power Pu as a function of input power Pi is as indicated in FIG. 5 by parameter Ids=2A, with the knee zone to be linearized.

If we now decrease the gate-source voltage Vgs of the transistor to obtain Ids=0.7A, the gain of the linear zone decreases to approximately 7 dB. Under these conditions when the input power Pi increases, Ids also tends to increase to a nominal value of 2A in conformity with the shape of Ids shown in the figure. The increase of Ids causes an increase in the gain Gi of the transistor just in the zone where the curve Pu(Ids=2A) had the knee, introducing in this case a self-linearization effect: the amplitude in the knee zone of the curve Pu(Ids=0-.7A) decreases greatly, offsetting the distortion curve AM/AM.

As concerns offsetting the conversion curve AM/PM, the phase variations can be offset by a circuit of known type upstream and which is piloted by the voltage Vds of the final transistor as described with reference to FIG. 1.

The variation now described can be used to advantage in QAM multi-level modulation systems where the RF output power is not constant, but varies considerably in relation to the average value depending on the point of the constellation of symbols to be transmitted. For example, in the 64QAM system there is a difference of approximately 8 dB between average and maximum RF output power. There is a considerable current savings; for the low levels of the constellation for which the output power Pu is low, the current Ids stays around 0.7A and reaches 2A only for the higher levels for which Pu is high. Since the points of the constellation are all equally probable, the average Ids current will be approximately 1.1–1.2A, and not 2A, with a clear consumption savings. A decrease of gain in the linear zone from 10 to 7 dB does not involve problems because the 3 dB difference is necessary only at the power peaks.

A second variation calls for the embodiment of the phase shifter as in FIG. 6, wherein the same symbols as in FIG. 1 indicate the same components interconnected in the same manner.

In FIG. 6 there has been added a second varicap diode D2 equal and antiparallel to D1 for the signals. The anode of D2 is connected to the cathode of D1, while the cathode of D2 is polarized by the direct voltage VP2 and is connected to ground for the signals through the filter capacitance C6.

The embodiment of FIG. 6 serves, in case it is desired, to offset a phase variation which may be either leading or delaying. One diode offsets the delaying phase variations and the other the leading ones. By appropriately sizing the voltages VP and VP2, it is possible to make one of the two diodes work while excluding the other, thus obtaining a leading phase shift with D2 inserted, or delaying with D1 inserted.

Figure 7:
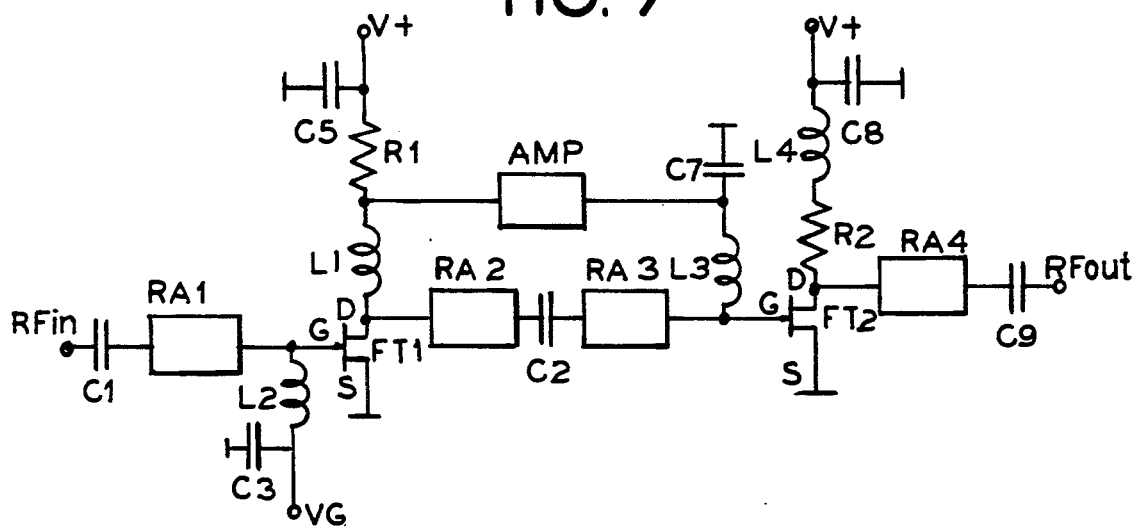
FIG. 7 shows a second embodiment variation of the phase shift element.

A third variation calls for an embodiment of the phase shifter as in FIG. 7 wherein the same symbols as in FIG. 1 indicate the same components interconnected in the same manner and performing the same functions.

In FIG. 7 the phase shifter is embodied by a GaAs-FET transistor indicated by FT2, and is polarized in such a manner as to function as a normal amplifier in a common source configuration with the continuous component of the drain-source current Ids2=1/2Idss. The latter is the maximum value of the drain current for Vgs=0.

R2 indicates the load resistance of FT2.

C7, C8, and C9 indicate capacitances and L3, L4 indicate inductances of known type. C9 and the networks C7-L3, C8-L4 form low-pass decoupling filters between signals and supplies for output RFout, gate FT2, and drain FT2; C7, C8 and C9 have one end grounded.

RA4 indicates an output matching network with the same function as RA1, RA2, and RA3.

By varying the continuous component of the gate-source voltage of FT2, there is obtained a variation of the continuous component of the drain current Ids. This does not cause an appreciable variation in the gain of FT2, since FT2 is in a linear operation condition, but does vary the value of gate-source capacitance Cgs of FT2. The effect obtained is equivalent to that supplied by the varactor diode D1 of FIG. 1, i.e. variation of the phase FL of the output signal RFout which offsets the AM/PM conversion curve (see FIG. 4).

In this case also the voltage detected in the modulation of the modulating signal (which is proportional to the continuous component of Ids of FT1 located at the ends of R1) is used as the control signal of the phase variation introduced by FT2. To bring this control signal to FT2, it is necessary to continuously pair the two transistors FT1 and FT2, bringing to the input of FT2 the voltage taken from R1 either in phase or in phase inverted fashion, depending on whether the phase variation desired is leading or delaying, respectively.

To introduce a phase delay there can be used the component indicated by AMP in FIG. 7, which is a continuous inverting amplifier with variable gain and a pass band having a width at least double that of the modulating input signal band. AMP receives and amplifies the continuous component of the drain voltage of FT1 at one end of R1, and supplies it with a changed sign to the gate of FT2 through the filter C7-L3 to obtain a modulation effect of the continuous component of the gate voltage of FT2. This effect is translated into a variation of the capacitance Cgs of FT2.

AMP can be embodied by a reversing stage of any known type. If embodied by a GaAsFET transistor, the entire circuit of FIG. 7 can be integrated in MMIC technology in a simple and economical embodiment.

If FT2 is not to lead but is to delay in phase, the amplifier AMP will have the same characteristics as above, except that it will not be reversing.

As another variation, the transistors called for in the various forms of embodiment described can also be of another type, e.g. bipolar.

Figure 7A:
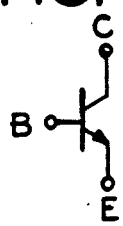
FIG. 7A shows a bipolar transistor which can replace the FET FT1 shown in FIG. 7.

This is shown in FIGS. 1A and 7A, wherein the bipolar transistors replace the FET FT1.

Although various minor changes and modifications might be proposed by those skilled in the art, it will be understood that we wish to include within the claims of the patent warranted hereon all such changes and modifications as reasonably come within our contribution to the art.

We claim as our invention:

1. A predistortion linearizer for a final microwave power amplifier subject to gain compression and phase distortion, comprising:

first subpolarized transistor means for providing gain expansion with increase in power of a signal at its input;

biasing means at said same input of the first transistor means for setting a subpolarization operating point thereof; and phase shifter means controlled by a continuous component of voltage present at an output of said first transistor means for introducing a phase distortion for offsetting the phase distortion of said final power amplifier.

2. A linearizer according to claim 1 wherein said first transistor means is placed upstream of said final power amplifier.

3. A linearizer according to claim 2 wherein said first transistor means comprises a bipolar common emitter configuration whose base polarization voltage is adjustable to obtain said subpolarization.

4. A linearizer according to claim 2 wherein said phase shifter means comprises a varactor diode placed in parallel with said first transistor means by being coupled continuously to the output of said first transistor means and signals present there, a polarization voltage of said varactor diode being adjustable.

5. A linearizer according to claim 2 wherein said phase shifter means comprises an amplifier stage placed downstream of said first transistor means and comprises a transistor in a common source configuration whose input is coupled continuously with the output of said first transistor means.

6. A linearizer according to claim 5 wherein said continuous coupling between the first transistor means and said transistor comprises a wide band inverting continuous amplifier.

7. A linearizer according to claim 5 wherein said continuous coupling between the first transistor means and said transistor comprises a wide band noninverting continuous amplifier.

8. A linearizer according to claim 2 wherein said phase shifter means comprises an amplifier stage placed downstream of said first transistor means and comprises a bipolar transistor in a common emitter configuration whose input is coupled continuously with the output of said first transistor means.

9. A predistortion linearizer for a final microwave power amplifier subject to gain compression and phase distortion, comprising:

first subpolarized transistor means placed upstream of said final power amplifier for providing gain expansion with increase in power of a signal at its input;

phase shifter means controlled by a continuous component of voltage present at an output of said first transistor means for introducing a phase distortion for offsetting the phase distortion of said final power amplifier; and said first transistor means comprising a GaAsFET in a common source configuration and whose gate polarization voltage is adjustable to obtain said subpolarization.

10. A predistortion linearizer for a final microwave power amplifier subject to gain compression and phase distortion, comprising:

first subpolarized transistor means placed upstream of said final power amplifier for providing gain expansion with increase in power of a signal at its input;

phase shifter means controlled by a continuous component of voltage present at an output of said first transistor means for introducing a phase distortion for offsetting the phase distortion of said final power amplifier; and said phase shifter means comprising two varactor diodes placed in antiparallel and coupled continuously to the output of said first transistor means and signals present there, a polarization voltage of each of said diodes being independently adjustable.

11. A predistortion linearizer system, comprising:

a final microwave power amplifier having a given gain compression and phase distortion;

upstream of an input of said final power amplifier a subpolarized transistor means for providing gain expansion with increase in power of a signal at its input for compensating said given gain compression of the final microwave power amplifier;

subpolarizing biasing means connected at an input of said subpolarized transistor means for setting said subpolarized transistor means in a subpolarized condition wherein a working point is near a cutoff point of the transistor means such that said increase in power of the signal at the input of the subpolarized transistor means changes the working point of the device further away from said cutoff point in order to increase gain thereof to provide said gain expansion; and phase shifter means which is independent of said subpolarizing biasing means and which is controlled by a component of voltage present at an output of said subpolarized transistor means for introducing a phase distortion for offsetting said given phase distortion of said final power amplifier.

12. A final microwave power amplifier having gain and phase compensation to compensate for a given gain compression and phase distortion of the amplifier, comprising:

a microwave power amplifier transistor;

means for providing gain expansion with increase in power of a signal at an input of the amplifier transistor for compensating said given gain compression of the power amplifier;

subpolarizing biasing means connected at an input of said amplifier transistor for setting said amplifier transistor in a subpolarized condition wherein a working point is near a cutoff point thereof such that said increase in power of the signal at the input of the transistor changes the working point of the device further away from said cutoff point in order to increase gain thereof to provide said gain expansion; and phase shifter means which is independent of said subpolarizing biasing means and which is controlled by a voltage present at an output of the amplifier transistor for introducing a phase distortion for offsetting said given phase distortion of said final power amplifier.

13. A final microwave power amplifier having compensation for gain compression and phase distortion thereof, comprising:

a transistor amplifier;

subpolarization biasing means connected to an input of said transistor amplifier for providing gain expansion with increase in power of the signal at the input of the transistor amplifier by setting a subpolarization operating point thereof; and phase shifter means controlled by a continuous component of voltage present at an output of said amplifier transistor for introducing a phase distortion for offsetting the phase distortion of said final power amplifier.

14. A predistortion linearizer for a final microwave power amplifier subject to gain compression and phase distortion, comprising:
first subpolarized transistor means for providing gain expansion with increase in power of a signal at its input; and
phase shifter means controlled by a continuous component of voltage present at an output of said first transistor means for introducing a phase distortion for offsetting the phase distortion of said final power amplifier.

15. A final microwave power amplifier having compensation for gain compression and phase distortion thereof, comprising:
a subpolarized transistor amplifier;
subpolarization biasing means connected to said transistor amplifier for providing gain expansion with increase in power of the signal at the input of the transistor amplifier by setting a subpolarization operating point thereof; and
phase shifter means controlled by a continuous component of voltage present at an output of said amplifier transistor for introducing a phase distortion for offsetting the phase distortion of said final power amplifier.

* * * * *